(12) United States Patent
Hongoh

(10) Patent No.: US 6,736,930 B1
(45) Date of Patent: May 18, 2004

(54) MICROWAVE PLASMA PROCESSING APPARATUS FOR CONTROLLING A TEMPERATURE OF A WAVELENGTH REDUCING MEMBER

(75) Inventor: Toshiaki Hongoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/536,721

(22) Filed: Mar. 28, 2000

(30) Foreign Application Priority Data

Mar. 29, 1999 (JP) .......................................... 11-085675

(51) Int. Cl.⁷ ............................................... H01L 21/00
(52) U.S. Cl. ........................... 156/345.41; 118/723 MW
(58) Field of Search ................................ 118/723 MW, 118/666; 156/345.41

(56) References Cited

U.S. PATENT DOCUMENTS

| | | | | |
|---|---|---|---|---|
| 5,134,965 A | * | 8/1992 | Tokuda et al. | 118/723 |
| 5,698,036 A | * | 12/1997 | Ishii et al. | 118/723 MW |
| 5,824,607 A | * | 10/1998 | Trow et al. | 438/732 |
| 5,935,334 A | * | 8/1999 | Fong et al. | 118/723 ME |
| 5,937,323 A | * | 8/1999 | Orczyk et al. | 438/624 |
| 5,988,104 A | * | 11/1999 | Nambu | 118/723 MW |

FOREIGN PATENT DOCUMENTS

| | | | | |
|---|---|---|---|---|
| JP | 01-036085 | * | 2/1989 | ............... 427/248.1 |
| JP | 01072526 A | * | 3/1989 | ......... H01L/21/302 |
| JP | 02197575 A | * | 8/1990 | ........... C23C/16/50 |
| JP | 3-191073 | | 8/1991 | |
| JP | 8-111297 | | 4/1996 | |
| JP | 9-63793 | | 3/1997 | |
| JP | 10-060657 | * | 3/1998 | |
| JP | 11-135480 | * | 5/1999 | |
| JP | 11-339997 | * | 12/1999 | |

* cited by examiner

*Primary Examiner*—Gregory Mills
*Assistant Examiner*—Michael Crowell
(74) *Attorney, Agent, or Firm*—Pillsbury Winthrop LLP

(57) ABSTRACT

A microwave plasma processing apparatus prevents the component parts of a process chamber from being influenced by heat associated with plasma, thereby improving the quality of plasma processing performed in the process chamber. A wavelength reducing member reduces a wavelength of a microwave transmitted therethrough. A slot electrode guides the microwave exiting the wavelength reducing member, the slot electrode provided adjacent to the wavelength reducing member. A first temperature control device controls a temperature of at least one of the slot electrode and component parts including the wavelength reducing member provided in the vicinity of the slot electrode. The microwave exiting the slot electrode is introduced to the process chamber so that plasma is generated by the microwave within the process chamber.

17 Claims, 3 Drawing Sheets

MICROWAVE PLASMA PROCESSING APPARATUS FOR CONTROLLING A TEMPERATURE OF A WAVELENGTH REDUCING MEMBER

BACKGROUND OF THE INVENTION

1. Field of the Invention

The present invention relates to a plasma processing apparatus and, more particularly, to a plasma processing apparatus using a microwave for generating plasma in a process chamber.

2. Description of the Related Art

Recently, in a semiconductor device manufacturing process, plasma processing apparatuses have been used to perform semiconductor producing processes such as a deposition process, an etching process or an ashing or stripping process since high-density integration and fine structure are required for semiconductor devices. Particularly, a microwave plasma processing apparatus has become popular since the microwave plasma processing apparatus is capable of generating stable plasma at a relatively low vacuum of 0.1 millitorr (mTorr) to several tens of mTorr. The microwave plasma processing apparatus generates high-density plasma by using a microwave or a combination of a microwave and a magnetic field generated by a ring-like coil.

In a typical microwave plasma processing apparatus, a 2.45 GHz microwave is introduced into a process chamber via a waveguide, a transmission window and a slot electrode, in that order. A reaction gas is also introduced into the process chamber, which is maintained at a predetermined negative pressure. The reaction gas introduced into the process chamber is changed into active radicals and ions by the microwave so as to produce plasma. An object to be processed such as a semiconductor wafer is placed in the process chamber so that a predetermined process such as an etching process is Performed on the object by utilizing action of the plasma.

The microwave may be passed through a wavelength reducing member made of a dielectric material before entering the slot electrode so that the wavelength of the microwave introduced into the process chamber is reduced or shortened. The wavelength reducing member is used to make it possible to use a reduces distance between adjacent slits formed in the slot electrode. A typical wavelength reducing member is disclosed in Japanese Laid-open Patent Application No. 9-63793.

The transmission window, which is formed of quartz or alumina, may deteriorate due to heat associated with plasma. The wavelength reducing member and the slot electrode are subjected to thermal expansion by the heat of the plasma. If the slot electrode, which is made of, for example, a copper plate, changes in its length due to thermal expansion, the length of each slit provided in the slot electrode is undesirably changed. This may cause a decrease in the plasma density or localization (unevenness) of the plasma in the process chamber.

The decrease in the plasma density may slow down a plasma processing speed such as an etching rate or a film deposition rate. As a result, if the plasma processing is controlled based on a processing time, there may be a case in which a desired result of the plasma processing (such as a depth by plasma etching or a thickness by plasma deposition performed on the semiconductor wafer) cannot be obtained when the plasma processing is applied for a predetermined time period. Additionally, if the plasma density in the process chamber is localized, the magnitude of the result of plasma processing may vary locally or be uneven on the semiconductor wafer.

In order to solve the above-mentioned problems, Japanese Laid-Open Patent Application No. 3-191073 discloses a microwave plasma processing apparatus having a cooling device to cool the transmission window using cooling water. Additionally, the above-mentioned Japanese Laid-Open Patent Application No. 9-63793 discloses a cooling jacket provided to a cover of the wavelength reducing member and the slot electrode.

However, Japanese Laid-Open Patent Application No. 9-63793 does not disclose a material usable for the wavelength reducing member. If an appropriate material is not selected for the wavelength reducing member, preferable heat transmission cannot be achieved. This may cause a problem in that a precise temperature control cannot be performed, and uniformity of plasma processing cannot be obtained.

Additionally, there are other component parts which do not have a good heat resistance, such as an O-ring provided between the process chamber and the wavelength reducing member. Accordingly, a temperature of such component parts must be maintained below a predetermined temperature so as to eliminate the influence of the heat associated with plasma.

On the other hand, in a plasma CVD apparatus which is one of the plasma processing apparatuses, it is preferable that a temperature inside the process chamber be maintained as high as possible so as to eliminate influence of water existing in the process chamber. That is, if water exists in the process chamber in the form of liquid or mist, the water may enter a film produced on a semiconductor wafer by the plasma processing. Accordingly, if a cooling device is provided to the process chamber without consideration of such a problem regarding water, the quality of plasma processing may be reduced.

As mentioned above, the conventional plasma processing apparatuses cannot eliminate undesirable influence of the heat associated with plasma while maintaining the quality of an object to be processed.

SUMMARY OF THE INVENTION

It is a general object of the present invention to provide an improved and useful microwave plasma processing apparatus in which the above-mentioned problems are eliminated.

A more specific object of the present invention is to provide a microwave plasma processing apparatus which can prevent the component parts of the process chamber from being influenced by heat associated with plasma, thereby improving the quality of plasma processing performed in the process chamber.

In order to achieve the above-mentioned objects, there is provided according to one aspect of the present invention a microwave plasma processing apparatus comprising: a wavelength reducing member reducing a wavelength of a microwave transmitted therethrough: a slot electrode guiding the microwave exiting the wavelength reducing member, the slot electrode provided adjacent to the wavelength reducing member; a first temperature control device controlling a temperature of at least one of the slot electrode and component parts including the wavelength reducing member provided in the vicinity of the slot electrode; and a process chamber into which the microwave exiting the slot electrode is introduced so that plasma is generated by the microwave within the process chamber.

According to the present invention, the temperature of the slot electrode is controlled by controlling the temperature of a component part adjacent to the slot electrode by utilizing transmission of heat between the slot electrode and the component parts such as the wavelength reducing member. That is, the temperature of the slot electrode can be maintained at a predetermined desired temperature. Thus, a length of each slit formed in the slot electrode can be maintained at a predetermined length, thereby generating plasma having a uniform density within the process chamber.

The microwave plasma processing apparatus may include a dielectric material member provided between the slot electrode and the process chamber, and the first temperature control device controls the temperature of the dielectric material member instead of the temperature of the wavelength reducing member so as to control the temperature of the slot electrode.

Additionally, there is provided according to another aspect of the present invention a plasma processing method comprising the steps of: placing an object to be processed in a process chamber; controlling a pressure inside the process chamber; controlling a temperature of a slot electrode radiating a microwave toward the process chamber by utilizing transmission of heat between the slot electrode and other component parts surrounding the slot electrode; introducing a reaction gas into the process chamber; supplying a microwave to the slot electrode; and processing the object by plasma of the reaction gas generated by the microwave introduced into the process chamber.

According to this invention, the temperature of the slot electrode radiating a microwave toward the process chamber is controlled by utilizing transmission of heat between the slot electrode and component parts surrounding the slot electrode. That is, the temperature of the slot electrode can be maintained at a predetermined desired temperature. Thus, a length of each slit formed in the slot electrode can be maintained at a predetermined length, thereby generating plasma having a uniform density within the process chamber.

Additionally, according to another aspect of the present invention a plasma processing method comprising: placing an object to be processed in a process chamber; controlling a pressure inside the process chamber; controlling a temperature of a slot electrode radiating a microwave toward the process chamber; introducing a reaction gas into the process chamber; supplying a microwave to the slot electrode when a temperature of the slot electrode is below a predetermined temperature; and processing the object by plasma of the reaction gas generated by the microwave introduced into the process chamber.

According to the present invention, a microwave is supplied to the slot electrode when the temperature of the slot electrode is below a predetermined temperature. That is, the temperature of the slot electrode increases due to the microwave transmitted therethrough, and the microwave is supplied when the slot electrode has reached a temperature which is a predetermined temperature below the temperature to be achieved when the plasma processing is being performed. This can eliminate over heating the slot electrode due to the heat generated by transmission of the plasma through the slot electrode.

Other objects, features and advantages of the present invention will become more apparent from the following detailed descriptions when read in conjunction with the accompanying drawings.

DETAILED DESCRIPTION OF THE PREFERRED EMBODIMENTS

Figure 1:
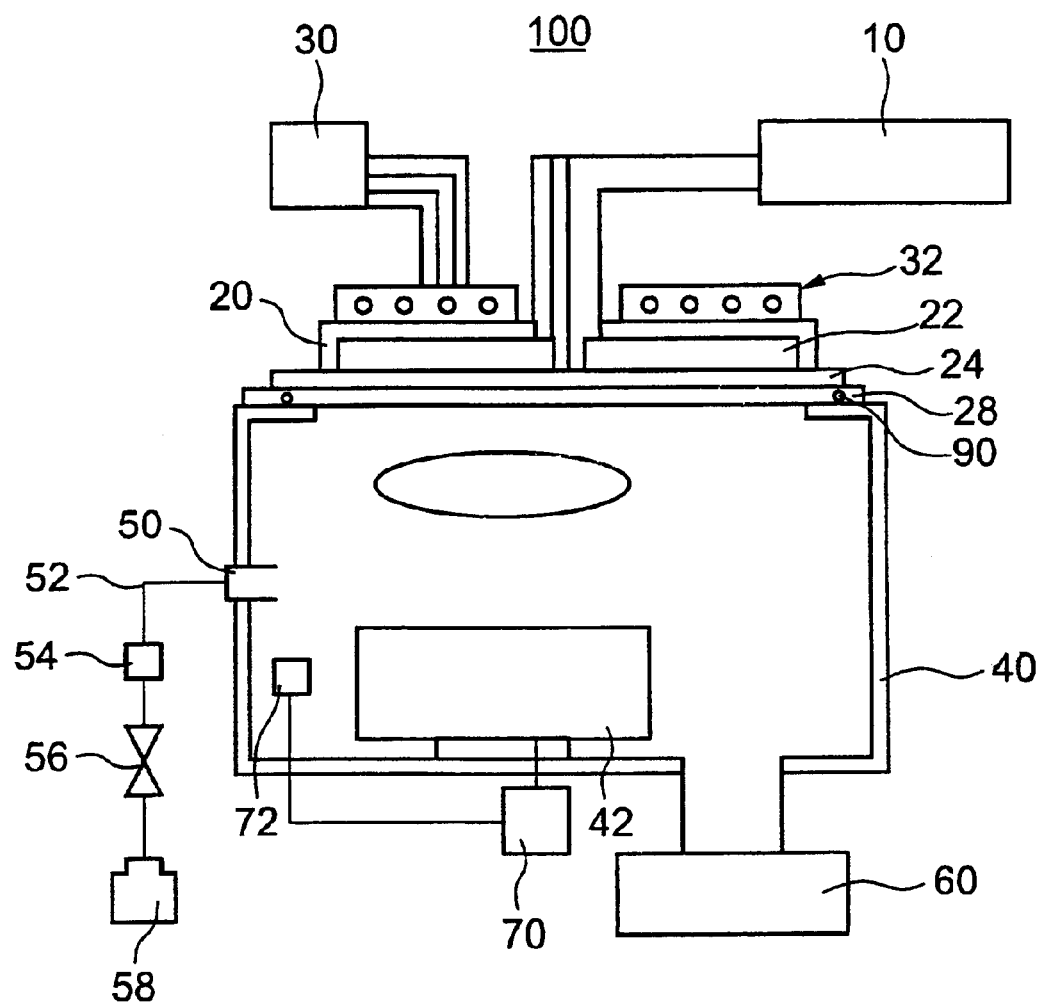
FIG. 1 is a schematic illustration of a microwave plasma processing apparatus according to a first embodiment of the present invention.

A description will now be given of a first embodiment of the present invention. FIG. 1 is a schematic illustration of a microwave plasma processing apparatus 100 according to the first embodiment of the present invention.

The microwave plasma processing apparatus 100 shown in FIG. 1 comprises a microwave generator 10, an antenna accommodating member 20, a slot antenna 24, a first temperature control device 30, a process chamber 40, a reaction gas supply nozzle 50, a vacuum pump 60 and a second temperature control device 70. A microwave having a wavelength ranging from about 1 GHz to about 100 GHz is generated by the microwave generator 10 and the microwave is introduced into the process chamber 40 via the slot electrode 24.

In the present embodiment, the microwave generator 10 comprises a magnetron, which can generate, for example, a 2.45-GHz, 5-kW microwave. The microwave generated by the microwave generator 10 is converted into a TM mode, a TE mode or a TEM mode by a mode converter (not shown in the figure). It should be noted that, in FIG. 1, an isolator for absorbing a microwave returning to the microwave generator 10 and a stub tuner for load matching are not shown for the sake of simplification of the figure.

The antenna accommodating member 20 contacts the slot electrode 24 so as to accommodate a wavelength reducing member 22 within a space defined by the antenna accommodating member 20 and the slot electrode 24 which serves as a bottom plate of the antenna accommodating member 20. The antenna accommodating member 20 is made of a material having a high heat conductivity such as stainless steel. Additionally, a temperature control plate 32 is placed on and contacts the antenna accommodating member 20 as described later. Accordingly, a temperature of the antenna accommodating member 20 can be controlled nearly equal to the temperature of the temperature controlling plate 32.

Figure 2:
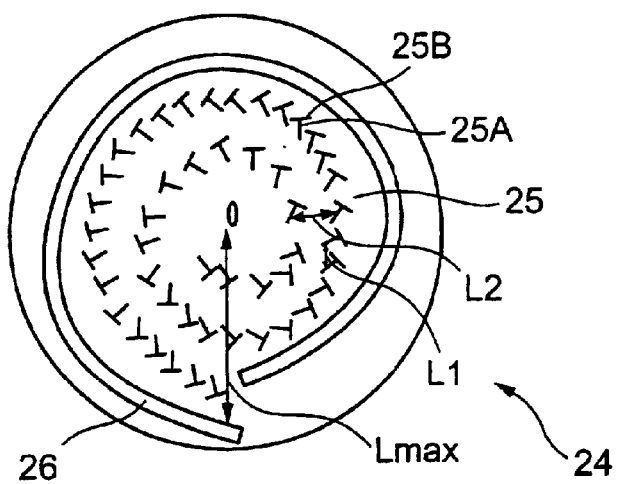
FIG. 2 is a plan view of a slot electrode provided in the plasma processing apparatus shown in FIG. 1.

The wavelength reducing member 22 is made of a material having a predetermined permittivity to reduce the wavelength of the microwave transmitted therethrough. The material of the wavelength reducing member 22 also has a high heat conductivity. As shown in FIG. 2, many slits 25 must be formed in the slot antenna 24 so as to achieve uniform plasma density in the process chamber 40. The wavelength reducing member 22 has a function to allow many slits 25 to be formed in the slot electrode 24.

Ceramics such as SiN or AlN can be used for the wavelength reducing member 22. For example, the specific permittivity $\epsilon_r$ of AlN is about 9 and, thus, the wavelength reducing rate n is 0.33 ($n=1/(\epsilon_r)^{1/2}=0.33$). Accordingly, the transmission rate of the microwave after passing through the wavelength reducing member 22 becomes 0.33 times the original transmission rate, and, thus, the wavelength also becomes 0.33 times the original wavelength. Accordingly, a distance between adjacent slits 25 can be reduced, resulting in a larger number of slits 25 being provided in the slot electrode 24.

The slot electrode 24 is formed of a copper plate having a circular shape whose diameter is, for example, about 50 cm and thickness is less than 1 mm. The slot electrode 24 is fixed to the wavelength reducing member 22 by screws. As shown in FIG. 2, the slot electrode 24 has many T-slits 25 that are arranged along a spiral which starts near the center O of the slot electrode 24 and extends toward the periphery in abut two turns.

In the present embodiment, each T-slit 25 as shown in FIG. 2 comprises a pair of slits 25A and 25B forming a T shape with a predetermined distance therebetween. More specifically, each of the slits 25A and 25B has a length L1 which is in the range of about one half of the wavelength $\lambda_0$ of the microwave to 2.5 times a free space wavelength. The width of each of the slits the 25A and 25B is about 1 mm. A distance L2 between two adjacent pairs of slits along a radial direction is approximately equal to the wavelength $\lambda_0$. That is, the length L1 of each of the slits 25A and 25B is set to satisfy the following relationship.

$$(\lambda_0/2 \times 1/\sqrt{\epsilon_r}) \leq L1 \leq (\lambda_0 \times 2.5)$$

By setting each of the slits 25A and 25B to the above-mentioned structure, a uniformly distributed microwave can be achieved.

A radiation element 26 having a width of about 1 mm is provided outside the spirally arranged T-slits 25 so as to prevent reflection of the microwave transmitted toward the periphery of the slot electrode 24. The radiation element 26 is provided for increasing an antenna efficiency of the slot electrode 24. It should be noted that the configuration of the pair of slits 25A and 25B is not limited to the above-mentioned T shape, and, for example, an L shaped slits may be used for the slot electrode 24.

Figure 3:
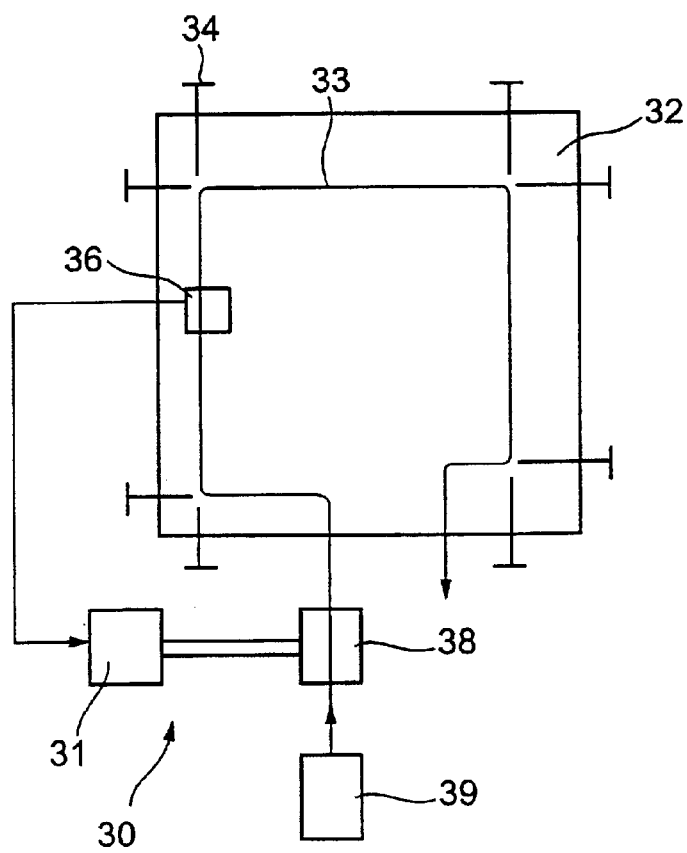
FIG. 3 is a schematic illustration of a structure of a first temperature control device.

The antenna accommodating member 20 is connected to the first temperature control device 30. The first temperature control device 30 controls temperatures of the antenna accommodating member 20 and component parts positioned adjacent to the antenna accommodating member 20 to fall into a predetermined temperature range. The first temperature control device 30 comprises, as shown in FIG. 3, a control unit 31, a temperature sensor 36 and a heater 38. Cooling water is supplied to the first temperature control device 30 from a water source 39.

For the purpose of easy control, it is preferable that the temperature of the cooling water supplied from the water source 39 be a constant temperature. The temperature control plate 32 is made of a material such as a stainless steel, which has a high heat conductivity and can be machined to form a fluid passage 33 therein. The fluid passage. 33 can be formed by boring elongated holes in the temperature control plate 32 and plugging open ends of the elongated holes by sealing members.34 such as screws. The configuration of the fluid passage 33 is not limited to that shown in FIG. 3, and the temperature control plate 32 and the fluid passage 33 may have arbitrary configurations. Additionally, instead of the cooling water, other coolant such as alcohol, gulden or flon may be used.

The temperature sensor 36 may comprise a platinum resistor, a thermistor or an infrared temperature sensor. A thermocouple may be used as the temperature sensor 36, but it is preferable that the thermocouple not be influenced by a microwave. The temperature sensor 36 is not necessarily connected to the fluid passage 33. Alternatively, the temperature sensor 36 may be configured to sense a temperature of at least one of the antenna accommodating member 20, the wavelength reducing member 22 and the slot electrode 24.

The heater 38 can be a heating wire wound on a water supply tube connected to the fluid passage 33 of the temperature control plate 32. That is, the temperature of the cooling water flowing through the fluid passage 33 is adjusted by controlling an electric current flowing through the heating wire. Since the temperature control plate 32 has a high heat conductivity, the temperature of the temperature control plate 32 can be controlled nearly equal to the temperature of the cooling water flowing through the fluid passage 33.

The temperature control plate 32 contacts the antenna accommodating member 20, and each of the antenna accommodating member 20 and the wavelength reducing member 22 has a high heat conductivity. Accordingly, the temperature of each of the wavelength reducing member 22 and the slot electrode 24 can be controlled by merely controlling the temperature of the temperature control plate 32.

The temperature of each of the wavelength reducing member 22 and the slot electrode 24 is increased due to an energy absorption when the microwave of the microwave generator 10 is supplied thereto for a long period of time. As a result, each of the wavelength reducing member 22 and the slot electrode 24 may deform due to thermal expansion.

For example, if the slot electrode 24 thermally deforms, the length of each slit is changed, which results in a decrease in the plasma density or localization of the plasma in the process chamber 40. The decrease in the plasma density may slow down a plasma processing speed such as an etching rate or a film deposition rate. As a result, if the plasma processing is controlled based on a processing time, there may be a case in which a desired result of the plasma processing (such as plasma etching depth or plasma deposition thickness) cannot be obtained when the plasma processing is applied for a predetermined time period (for example, two minutes), that is, for example, if a semiconductor wafer is processed for a predetermined time (for example, two minutes) and thereafter removed from the process chamber 40. Additionally, if the plasma density in the process chamber 40 is localized, the magnitude of plasma processing applied to the semiconductor wafer may be locally changed. As mentioned above, if a deformation occurs in the slot electrode 24, the quality of plasma processing may deteriorate.

Further, if the temperature control plate 32 is not provided, the slot electrode may warp since the wavelength reduction member 22 and the slot electrode 24 are different from each other and the both members are fixed to each other by screws. In such a case, the quality of plasma processing may deteriorate for a reason similar to the above-mentioned reason.

On the other hand, the slot electrode 24 does not deform if the slot member is placed in a high-temperature atmosphere as long as the temperature is maintained unchanged. Additionally, in a plasma CVD apparatus which is an example of the plasma processing apparatus according to the present embodiment, it is preferable that a temperature inside the process chamber 40 be maintained as high as possible so as to eliminate influence of water existing in the process chamber 40. That is, if water exists in the process chamber 40 in the form of liquid or mist, the water may enter a film deposited on a semiconductor wafer by the plasma processing.

Additionally, considering heat resistance of component parts such as an O-ring 90 provided between the process chamber 40 and a dielectric material member 28 so as to seal the process chamber 40, the temperature control plate 32 (that is, the slot electrode 24) is preferably controlled to be 70±5° C. The setting temperature of 70° C. and the allowable range of ±5° C. can be arbitrarily set according to a process to be performed and heat resistance of component parts.

In the present embodiment the first temperature control device 30 controls an electric current supplied to the heater 38 based on temperature information output from the temperature sensor 36 so that the temperature of the temperature control plate 32 is 70±5° C. The control of the electric current may be performed by, for example, a variable resistor. Assuming that the slot electrode 24 is used at a temperature of 70±5° C., the slot electrode 24 is designed so that the length of each slit is an optimum when the slot electrode 24 is placed at 70° C. Alternatively, when the temperature sensor 36 is provided to the temperature control plate 32, a wider temperature range of 70±10° C. may be applied since the transmission of heat between the temperature control plate 32 and the slot electrode 24 takes a longer time.

In the first temperature control device 30, a temperature of the cooling water is raised to 70° C. by driving the heater 38 at the initial stage since the temperature of the temperature control plate 32, which is placed at a room temperature, is lower than 70° C. Alternatively, the supply of the cooling water may be stopped until the temperature of the temperature control plate 32 reaches about 70° C. Accordingly, the first temperature control device 30 shown in FIG. 3 includes a mass flow controller for controlling an amount of the cooling water and a stop valve.

When the temperature of the temperature control plate 32 exceeds 75° C., the first temperature control device 30 starts to supply the cooling water of about 15° C. from the water source 39 so as to cool the temperature control plate 32. Thereafter, when the temperature information of the temperature sensor 36 indicates 15° C., the first temperature control device 30 controls to maintain the temperature of the temperature control plate 32 to be in the range of 70±10° C. Specifically, the first temperature control device 30 operates the mass flow controller and the stop valve so as to supply the cooling water from the water source 39 to the temperature control plate 32. Thereafter, the first temperature control device 30 stops the supply of the cooling water when the temperature information of the temperature sensor 36 indicates 70° C.

As mentioned above, the first temperature control device 30 differs from the cooling means disclosed in the above-mentioned Japanese Laid-Open Patent Application No. 3-191073 in that the first temperature control device 30 controls the temperature of the wavelength reducing member 22 and the slot electrode 24 to be in the predetermined temperature range while the cooling means disclosed in Japanese Laid-Open Patent Application No. 3-191073 merely cools the slot electrode without setting a temperature control range.

By the above-mentioned control system, a plasma density in the process chamber 40 can be controlled to achieve a high quality plasma processing. It can be appreciated that if the slot electrode 24 is designed so that an optimum length of each slit of the slot electrode 24 is achieved at the temperature of 70° C. and if the control is performed to merely lower the temperature of a slot electrode to a temperature around 15° C., an optimum processing environment cannot be achieved.

Additionally, the first temperature control device 30 can simultaneously control the temperatures of both the wavelength reducing member 22 and the slot electrode 24 by controlling an amount of cooling water flowing through the temperature control plate 32. This is because each of the temperature control plate 32, the antenna accommodating member 20 and the wavelength reducing member 22 is made of a material having a high heat conductivity. According to such a structure, these three component parts can be controlled by a single temperature control device. Thus, the size and cost of the entire apparatus can be reduced. It should be noted that the temperature control plate 32 is one of examples of temperature control means, and other cooling means such as a cooling fan may be used instead of the cooling water system according to the present embodiment.

Figure 4:
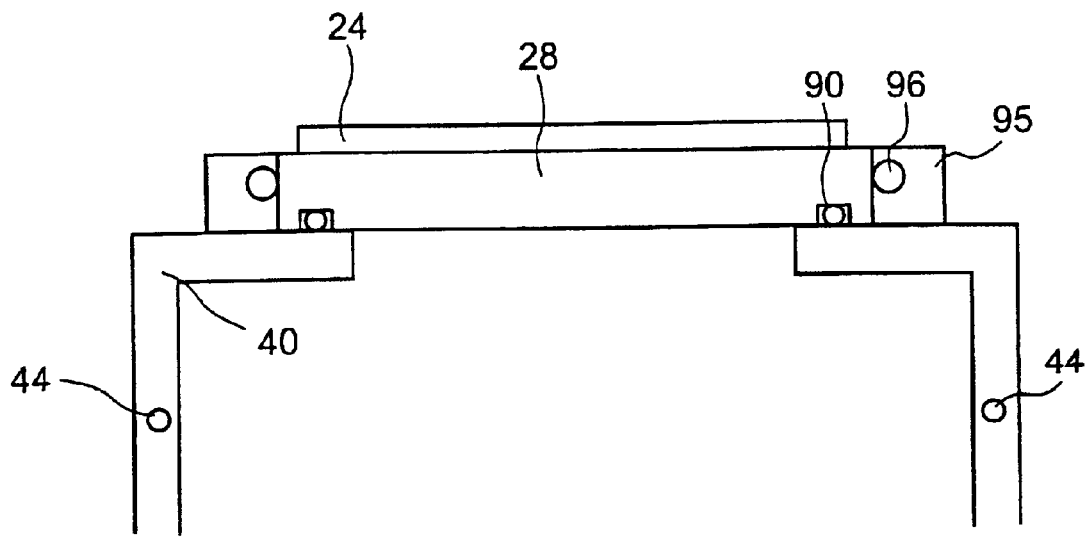
FIG. 4 is a schematic illustration of a third temperature control device.

A description will now be given, with reference to FIG. 4, of a third temperature control device 95. FIG. 4 is a schematic illustration of the third temperature control device 95.

The third temperature control device 95 controls a temperature of the dielectric material member 28 by using cooling water or coolant. The third temperature control device 95 can be constituted by a temperature sensor and a heater similar to the first temperature control device, and descriptions there of will be omitted.

In the present embodiment, although the temperature control plate 32 and the antenna accommodating member 20 are separate from each other, the function of the temperature control plate 32 can be provided to the antenna accommodating member 20. For example, the antenna accommodating member 20 can be directly cooled by providing a fluid passage 96 on a side and/or a top surface of the antenna accommodating member 20. Since the seal between the dielectric material member 28 and the process chamber 40 is achieved by the O-ring 90, the temperature control device 95 shown in FIG. 4 effectively cools the O-ring 90.

Figure 5:
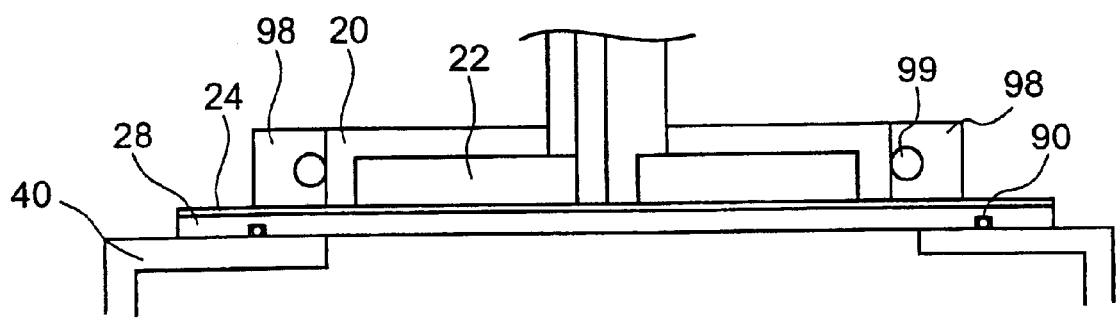
FIG. 5 is a schematic illustration of a variation of a temperature control plate.

FIG. 5 is a schematic illustration of a variation of the temperature control plate 32 shown in FIG. 1. As shown in FIG. 5, the wavelength reducing member 22 and the slot electrode 24 can be simultaneously and effectively cooled by providing a temperature control plate 99 having a fluid passage 99 to cool the side of the antenna accommodating member 20. Alternatively, a temperature control plate may be provided around the slot electrode 24, or a fluid passage for cooling water may be provided in the slot electrode 24 while avoiding interference with the slits 25 also formed in the slot electrode 24.

The dielectric material member 28 is provided between the slot electrode 24 and the process chamber 40 so as to close the top opening of the process chamber 40. The slot electrode 24 is tightly joined to the surface of the dielectric material member 28 by brazing. Alternatively, as shown in FIG. 5, the slot electrode can be formed by a copper plate applied to the surface of the dielectric material member 28.

The dielectric material member 28 is made of a dielectric material such as aluminum nitride (AlN). The dielectric material member 28 prevents the slot electrode 24 from being deformed due to a negative pressure generated in the process chamber 40. Additionally, the dielectric material member 28 prevents the slot electrode 24 from being exposed to the atmosphere inside the process chamber 40 so that the environment inside the process chamber 40 is prevented from being contaminated by copper. If necessary, the dielectric material member 28 may be formed of a dielectric material having a low heat conductivity so as to prevent the slot electrode 24 from being influenced by heat from the process chamber 40.

Alternatively, the dielectric material member 28 may be formed of a dielectric material having a high heat conductivity such as AlN. In such a case, the temperature of the slot electrode 24 can be controlled by controlling the temperature of the dielectric material member 28, subsequently, the temperature of the wavelength reducing member 22 can be controlled via the slot electrode 24. It should be noted that a fluid passage for providing the cooling water can be directly formed within the dielectric material member 28.

The process chamber 40 as shown in FIG. 1 has a cylindrical shape whose side wall and bottom plate are made of a conductive material such as aluminum. The process chamber 40 can be maintained at a predetermined negative pressure by a vacuum pump 60. A heating plate 42 is provided inside the process chamber 40 so that an object to be processed such as a semiconductor wafer is placed on the heating plate 42. It should be noted that an electrostatic chuck or clamping mechanism is not shown in FIG. 1 for the purpose of simplification of the drawing.

The heating plate 42 has a similar structure with the heater 38 so as to control the temperature of the semiconductor wafer. For example, in a plasma CVD process, the semiconductor wafer is heated at a temperature of about 450° C. by the heating plate 42. On the other hand, in a plasma etching process, the semiconductor wafer is heated to a temperature of less than 80° C. Accordingly, the temperature achieved by the heating plate 42 differs for each process to be applied to the semiconductor wafer.

In any process, the heating plate 42 heats the semiconductor wafer so that water does not adhere to or enter the semiconductor wafer as impurities. A second temperature control device 70 shown in FIG. 1 controls an electric current supplied to the heating plate 42 in accordance with a temperature sensed by a temperature sensor 72 which senses the temperature of the heating plate 42.

The supply nozzle 50 made of a quartz pipe is provided on a side wall of the process chamber for introducing a reaction gas into the process chamber 40. The nozzle 50 is connected to a reaction gas source 58 via a mass flow controller 54 and a stop valve 56. For example, in order to deposit a silicon nitride film, $NH_3$ or $SiH_4$ is mixed with a mixture gas of $N_2$, $H_2$ and one of neon, xenon, argon, helium, radon and krypton.

The vacuum pump 60 can maintain a pressure of the process chamber 40 at a predetermined negative pressure in the range of 0.1 mTorr to 10 mTorr. It should be noted that a detail of the exhaust system is not shown in FIG. 1.

As shown in FIG. 4, a fluid passage 44 is formed in an upper portion of the side wall of the process chamber 40 so as to control the temperature of the upper portion of the side wall of the process chamber 40. That is, the cooling water which passed through the fluid passage of the first temperature control device 30 is supplied to the fluid passage 44.

A description will now be given of an operation of the microwave plasma processing apparatus 100 according to the present embodiment.

First, a semiconductor wafer is inserted into the process chamber 40 by a conveyor arm through a gate valve (not shown in the figure) provided on the side wall of the process chamber 40. Thereafter, the semiconductor wafer is placed on a predetermined table by moving a lifter pin (not shown in the figure).

Thereafter, air in the process chamber 40 is evacuated, and the pressure in the process chamber 40 is maintained to be 50 mtorr. Then, a reaction gas is supplied from the reaction gas source 58, and is introduced into the process chamber 40 via the mass flow controller 54 and the stop valve 56.

The temperature inside the process chamber 40 is maintained to be 70° C. by the second temperature control device 70 and the heating plate 42. Additionally, the first temperature control device 30 controls the heater 38 so that the temperature of the temperature control plate 32 becomes about 70° C. Thereby, the wavelength reducing member 22 and the slot electrode 24 are maintained at about 70° C. The slot electrode 24 is designed so that the length of each slit is optimized at 70° C. Additionally, it is assumed that the allowable tolerance of the temperature of the slot electrode is ±5° C. When the plasma is generated, the temperature of the slot electrode 24 is raised by the heat of the plasma. Accordingly, the heat generated by plasma may be controlled so as to introduce a microwave into the slot electrode 24 when the slot electrode 24 is below a predetermined temperature.

On the other hand, a microwave from the microwave source 10 is introduced into the wavelength reducing member 22 accommodated in the antenna accommodating member 20 via a square waveguide or a coaxial wave guide (not shown in the figure) in, for example, a TEM mode. The microwave passed through the wavelength reducing member 22 is reduced in its wavelength, and enters the slot electrode 24. The microwave is directed toward the process chamber 40 by the slits 25, and is introduced into the process chamber 40 via the dielectric material member 28. Since the temperature of the wavelength reducing member 22 and the slot electrode 24 is controlled, there is no deformation due to thermal expansion and the slot electrode 24 can have slits 25 having an optimum length. Accordingly, the microwave can be introduced into the process chamber 40 with a uniform density over the entire process chamber 40 without localization.

If the temperature of the temperature control plate 32 exceeds 75° C., the first temperature control device 30 supplies the cooling water of about 15° C. from the water source 39 to the temperature control plate 32. Similarly, when the temperature of the temperature control plate 32 goes down below 65° C., the first temperature control device 30 controls the heater 38 so as to raise the temperature of the cooling water supplied from the water source 39 to the temperature control plate 32. Accordingly, the temperature of the temperature control plate 32 can be raised above 65° C.

On the other hand, when the temperature sensor 72 senses that the temperature of the process chamber 40 is below a predetermined temperature due to over cooling by the temperature control plate 32, the second temperature control device 70 controls the heating plate 42 to control the temperature of the process chamber 40 so as to prevent water from adhering to or entering the wafer as impurities.

Thereafter, the microwave converts the reaction gas into plasma so as to perform a plasma deposition process. The plasma deposition process is performed for a predetermined period of time, and thereafter the semiconductor wafer is removed from the process chamber 40 through the gate valve. Since the plasma generated in the process chamber 40 has uniform density, the film produced by the plasma deposition has a uniform thickness. Additionally, since the process chamber 40 is maintained at a predetermined temperature at which water does not enter the wafer, a good quality deposition film can be obtained.

It should be noted that since the microwave plasma processing apparatus 100 according to the present embodiment does not prevent use of an electron cyclotron resonance, a coil generating a predetermined magnetic field may be provided to the microwave plasma processing apparatus 100. Additionally, since the microwave plasma processing apparatus 100 according to the present embodiment may be used to perform a plasma etching process or plasma cleaning process on the semiconductor wafer instead of performing the plasma deposition process. Further, the object to be processed is not limited to the semiconductor wafer, and other materials such as LCD may be processed by the microwave plasma processing apparatus 100 according to the present embodiment.

The present invention is not limited to the specifically disclosed embodiments, and variations and modifications may be made without departing from the scope of the present invention.

The present application is based on Japanese priority application No. 11-85675 filed on Mar. 29, 1999, the entire contents of which are hereby incorporated by reference.

What is claimed is:

1. A microwave plasma processing apparatus comprising:
   a wavelength reducing member constructed and arranged to reduce a wavelength of a microwave transmitted therethrough;
   a slot electrode guiding the microwave exiting the wavelength reducing member, the slot electrode provided adjacent to the wavelength reducing member;
   a process chamber into which the microwave exiting the slot electrode is introduced so that a plasma is generated by the microwave within the process chamber;
   a first temperature control device comprising a fluid supply tube connected to a fluid passage in a temperature control plate and a heating wire wound on the fluid supply tube,
   wherein said first temperature control device is configured to heat at least one of the slots electrode and component parts including the wavelength reducing member above a lower temperature limit and to cool at least one of the slot electrode and component parts including the wavelength reducing member below a higher temperature limit.

2. The microwave plasma processing apparatus as claimed in claim 1,
   wherein the first temperature control device controls the temperature of the slot electrode to be in a predetermined temperature range so as to substantially eliminate influence of water released from components in the process chamber on a substrate being processed.

3. The microwave plasma processing apparatus as claimed in claim 2, wherein the predetermined temperature range is 70±10° C.

4. The microwave plasma processing apparatus as claimed in claim 1, wherein the first temperature control device controls the temperature of the wavelength reducing member so as to control the temperature of the slot electrode by utilizing transmission of heat between the wavelength reducing member and the slot electrode.

5. The microwave plasma processing apparatus as claimed in claim 1, further comprising an antenna accommodating member accommodating the wavelength reducing member, wherein the first temperature control device controls a temperature of the antenna accommodating member so as to control the temperature of each of the wavelength reducing member and the slot electrode by utilizing transmission of heat between the antenna accommodating member and each of the wavelength reducing member and the slot electrode.

6. The microwave plasma processing apparatus as claimed in claim 1, further comprising a dielectric material member interposed between the slot electrode and the process chamber, wherein the first temperature control device controls the temperature of one of the wavelength reducing member and the dielectric material member so as to control the temperature of the slot electrode by utilizing transmission of heat between the slot electrode and the one of the wavelength reducing member and the dielectric material member.

7. The microwave plasma processing apparatus as claimed in claim 1, further comprising a second temperature control device controlling a temperature of an object to be processed within the process chamber.

8. The microwave plasma processing apparatus as claimed in claim 6, further comprising a third temperature control device controlling a temperature of a periphery of the dielectric material member.

9. The microwave plasma processing apparatus as claimed in claim 1, wherein the first temperature control device includes a temperature control arrangement for controlling a temperature of a side wall of the process chamber.

10. The microwave plasma processing apparatus as claimed in claim 1,
    wherein the first temperature control device comprises:
    a control unit;
    a temperature sensor; and
    a heater.

11. The microwave plasma processing apparatus as claimed in claim 10,
    wherein the temperature sensor includes at least one of a platinum resistor, a thermistor, an infrared temperature sensor, and a thermocouple.

12. The microwave plasma processing apparatus as claimed in claim 10,
    wherein the temperature sensor is configured to sense a temperature of at least one of the wavelength reducing member and the slot electrode.

13. A microwave plasma processing apparatus comprising:
    a wavelength reducing member constructed and arranged to reduce a wavelength of a microwave transmitted therethrough;
    a slot electrode guiding the microwave exiting the wavelength reducing member, the slot electrode provided adjacent to the wavelength reducing member;
    a process chamber into which the microwave exiting the slot electrode is introduced so that a plasma is generated by the microwave within the process chamber;
    a first temperature control device comprising:
    a control unit;
    a temperature sensor; and
    a heater comprising a heating wire wound on a fluid supply tube connected to a fluid passage in a temperature control plate to supply a fluid to the temperature control plate;
    said first temperature control device being configured to control a temperature of at least one of the slot electrode and component parts including the wavelength reducing member provided in the vicinity of the slot electrode within a predetermined range of temperatures by heating at least one of the slot electrode and component parts including the wavelength reducing member above a lower temperature limit and cooling at least one of the slot electrode and component parts including the wavelength reducing member below a higher temperature limit.

14. The microwave plasma processing apparatus as claimed in claim 10, wherein the control unit controls an electric current supplied to the heater based on temperature information output from the temperature sensor.

15. The microwave plasma processing apparatus as claimed in claim 1, wherein the first temperature control device includes a stop valve and a mass flow controller configured and arranged to control an amount of fluid.

16. The microwave plasma processing apparatus as claimed in claim 15, wherein the first temperature control device operates the mass flow controller and the stop valve so as to supply the fluid from a fluid source to a temperature control plate.

17. The microwave plasma processing apparatus as claimed in claim 16, wherein the first temperature control device simultaneously controls both the temperature of the wavelength reducing member and the temperature of the slot electrode by controlling an amount of fluid flowing through the temperature control plate.

* * * * *